(12) United States Patent
Andry et al.

(10) Patent No.: US 7,741,226 B2
(45) Date of Patent: Jun. 22, 2010

(54) OPTIMAL TUNGSTEN THROUGH WAFER VIA AND PROCESS OF FABRICATING SAME

(75) Inventors: Paul S. Andry, Yorktown Heights, NY (US); Edward C. Cooney, III, Jericho, VT (US); Peter J. Lindgren, Essex Junction, VT (US); Dorreen J. Ossenkop, North Hudson, NY (US); Cornelia K. Tsang, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 88 days.

(21) Appl. No.: 12/115,568

(22) Filed: May 6, 2008

(65) Prior Publication Data

US 2009/0280643 A1    Nov. 12, 2009

(51) Int. Cl.
 *H01L 21/311* (2006.01)
(52) U.S. Cl. ............... 438/701; 438/700; 438/702; 438/703; 438/713; 438/719; 257/170; 257/244; 257/374; 257/510; 257/513
(58) Field of Classification Search .......... 438/700, 438/701, 702, 703, 713, 719, 720, FOR. 388, 438/FOR. 405; 257/170, 244, 283, 374, 257/395, 396, 397, 510, 513, 520, 622, E23.131, 257/E21.238
See application file for complete search history.

(56) References Cited

U.S. PATENT DOCUMENTS

| | | | |
|---|---|---|---|
| 6,943,109 B2 | 9/2005 | Ogasawara et al. | |
| 7,022,601 B2 | 4/2006 | Jung et al. | |
| 2001/0007797 A1 | 7/2001 | Jang et al. | |
| 2004/0115929 A1 | 6/2004 | Lim | |
| 2005/0023702 A1 | 2/2005 | Nishimura et al. | |
| 2006/0046456 A1 | 3/2006 | An | |
| 2006/0046457 A1 | 3/2006 | Tanaka | |
| 2006/0252252 A1 | 11/2006 | Zhu et al. | |
| 2007/0026631 A1* | 2/2007 | Lin et al. | 438/424 |
| 2008/0073752 A1* | 3/2008 | Asai et al. | 257/615 |
| 2008/0290515 A1* | 11/2008 | Arunachalam et al. | 257/751 |
| 2009/0230507 A1* | 9/2009 | Riess et al. | 257/532 |

* cited by examiner

*Primary Examiner*—N Drew Richards
*Assistant Examiner*—Joannie A Garcia
(74) *Attorney, Agent, or Firm*—Scully, Scott, Murphy & Presser, P.C.; Richard M. Kotulak, Esq.

(57) ABSTRACT

A method of optimally filling a through via within a through wafer via structure with a conductive metal such as, for example, W is provided. The inventive method includes providing a structure including a substrate having at least one aperture at least partially formed through the substrate. The at least one aperture of the structure has an aspect ratio of at least 20:1 or greater. Next, a refractory metal-containing liner such as, for example, Ti/TiN, is formed on bare sidewalls of the substrate within the at least one aperture. A conductive metal seed layer is then formed on the refractory metal-containing liner. In the invention, the conductive metal seed layer formed is enriched with silicon and has a grain size of about 5 nm or less. Next, a conductive metal nucleation layer is formed on the conductive metal seed layer. The conductive metal nucleation layer is also enriched with silicon and has a grain size of about 20 nm or greater. Next, a conductive metal is formed on the conductive metal nucleation layer. After performing the above processing steps, a backside planarization process is performed to convert the at least one aperture into at least one through via that is now optimally filled with a conductive metal.

22 Claims, 5 Drawing Sheets

OPTIMAL TUNGSTEN THROUGH WAFER VIA AND PROCESS OF FABRICATING SAME

RELATED APPLICATIONS

This application is related to U.S. application Ser. No. 12/115,564, which application is being filed concurrently on the same date as the present application.

FIELD OF THE INVENTION

The present invention generally relates to through wafer vias within microelectronic structures. More particularly, the present invention relates to a through wafer via structure having optimal conductive metal, e.g., tungsten, fill and a method of fabricating such a through wafer via structure.

BACKGROUND OF THE INVENTION

Microelectronic structures, and in particular semiconductor structures, include microelectronic devices such as semiconductor devices. The microelectronic devices are located and formed over a microelectronic substrate, such as a semiconductor substrate. The microelectronic devices are connected and interconnected using patterned conductor layers that are separated by dielectric layers.

In addition to the connection and interconnection of microelectronic devices within a microelectronic structure while using patterned conductor layers that are separated by dielectric layers, microelectronic structures, and in particular semiconductor structures, also frequently use through wafer (or substrate) via structures that provide an electrical connection from a top side to a bottom side of a microelectronic substrate, such as a semiconductor substrate.

Through wafer vias when used within microelectronic substrates may serve functions that include, but are not necessarily limited to, microelectronic substrate grounding functions and microelectronic substrate electrical biasing functions.

While through wafer vias within microelectronic substrates serve valuable functions, through wafer vias within microelectronic substrates are not entirely without problems. In particular, through wafer vias are often difficult to efficiently fabricate and effectively fill with a comparatively narrow linewidth (i.e., in a range from about 5 to about 0.1 microns), while substantially or completely penetrating through a microelectronic substrate having an increased thickness.

Various aspects of vias in general, potentially including but not limited to through wafer vias, are known in the microelectronic fabrication art.

For example, Jang et al., in U.S. Patent Application Publication No. 2001/0007797, teaches a method for forming a tungsten via over a titanium containing barrier layer within a contact aperture to form a contact structure within a semiconductor structure absent delamination of the contact structure. The method includes forming and annealing a tungsten seed layer, while using a fluorine containing source gas, over the titanium containing barrier layer prior to forming the tungsten via over the titanium containing barrier layer.

In addition, Lim in U.S. Patent Application Publication No. 2004/0115929, teaches a method for forming a tungsten via within a contact aperture within a semiconductor structure with enhanced step coverage. The method includes first forming within the contact aperture a tungsten nitride barrier layer while using an atomic layer deposition (ALD) method.

Further, Nishimura et al., in U.S. Patent Application Publication No. 2005/0023702, teaches a method for forming a tungsten via within a contact aperture within a semiconductor structure, absent a void within the tungsten via. The method includes a two-step deposition of the tungsten via, where the crystal grains within the tungsten deposited within the first step are 30 nm or less.

Still further, Ogasawara et al., in U.S. Pat. No. 6,943,109, teaches a method for forming a tungsten via within an aperture within a semiconductor structure with comparatively low resistance and high reliability. The method includes treating the aperture with a fluorine containing gas prior to filling the aperture with the tungsten via.

Still yet further, An, in U.S. Patent Application Publication No. 2006/0046456, teaches a dual damascene method for forming a dual damascene structure with enhanced performance within a semiconductor structure. The dual damascene structure includes a tungsten via within a via portion of the dual damascene structure and a copper interconnect within an interconnect portion of the dual damascene aperture.

Yet still further, Tanaka, in U.S. Patent Application Publication No. 2006/0046457, teaches a method for forming a tungsten via within an aperture within a semiconductor structure. The method uses a post deposition purge of fluorine from a tungsten via deposited using a tungsten fluoride deposition material.

In addition, Jung et al., in U.S. Pat. No. 7,022,601, teaches a method for forming a tungsten via within an aperture within a semiconductor structure absent of defects. The method uses a barrier layer comprising a tungsten-silicon-nitride material deposited prior to the tungsten via.

Finally, Zhu et al., in U.S. Patent Application Publication No. 2006/0252252, teaches a method for forming a contact layer contacting a tungsten via with enhanced performance within a semiconductor structure. The method provides for first cleaning a tungsten oxide from the tungsten via prior to forming the contact layer contacting the tungsten via.

The use of through wafer vias is likely to be of continued prominence and importance as microelectronic device and microelectronic structure dimensions decrease, and as microelectronic circuit functionality and performance requirements increase. To that end, desirable are through wafer via structures having enhanced performance, and methods for fabricating those through wafer via structures. In particular, there is a need for providing a method that can be used to optimally fill through wafer via structures with a conductive metal, such as tungsten, W, while retaining excellent conductive metal to dielectric adhesion.

SUMMARY OF THE INVENTION

In one aspect of the invention, a method of fabricating a through wafer via structure having an optimal conductive metal, i.e., tungsten (W), fill which improves the current carry load within the through wafer via structure is provided. More particularly, the present invention provides a method of optimally filling at least one aperture within a substrate that has an aspect ratio (i.e., the ratio of the height to width of the at least one aperture) of about 20:1 or greater, preferably about 30:1 or greater, and more preferably about 50:1 or greater, with a conductive metal, while retaining excellent conductive metal to dielectric adhesion. At least one aperture of the substrate forms at least one through wafer via incident to subsequent processing of the substrate.

In broad terms, the method of the present invention includes:

providing a structure including a substrate having at least one aperture at least partially formed through said substrate, said at least one aperture having an aspect ratio of at least 20:1 or greater;

forming a refractory metal-containing liner on bare sidewalls of said substrate within said at least one aperture;

forming a conductive metal seed layer on said refractory metal-containing liner, said conductive metal seed layer is enriched with silicon and has a grain size of about 5 nm or less;

forming a conductive metal nucleation layer on said conductive metal seed layer, said conductive metal nucleation layer is enriched with silicon and has a grain size of about 20 nm or greater; and forming a conductive metal layer on said conductive metal nucleation layer.

The method of the present invention, also includes, forming at least one via from said at least one aperture after said at least one aperture is filled with said conductive metal layer.

In one embodiment of the inventive method, the at least one aperture includes a particular sidewall profile. The particular sidewall profile includes, downwardly progressing through the substrate: (1) a first comparatively wide region at a surface of the substrate; (2) a constricted region contiguous with the first comparatively wide region; (3) a second comparatively wide region contiguous with the constricted region; and (4) an inward tapered region contiguous with the second comparatively wide region. The foregoing sidewall profile provides for ease in filling the aperture, while providing for desirable geometric localization of any voids that form when forming the through via. In the invention, the terms "through via" or "via" denote an opening that extends partially, or nearly entirely from one surface of the substrate to an opposing surface of the substrate. In the present invention, the through wafer vias extend significantly through, but not entirely, through the wafer. A backside thinning process is used to expose the bottom of the through wafer via. The opening is filled with a conductive metal and thus it allows communication of one side of the substrate to another side of the substrate.

In a highly preferred embodiment, the method of the present invention includes:

providing a structure including a substrate having at least one aperture at least partially formed through said substrate, said at least one aperture having an aspect ratio of at least 20:1 or greater;

forming a Ti-containing liner on bare sidewalls of said substrate within said at least one aperture;

forming a W seed layer on said refractory metal-containing liner, said W seed layer is enriched with silicon and has a grain size of about 5 nm or less;

forming a W nucleation layer on said W seed layer, said W nucleation layer is enriched with silicon and has a grain size of about 20 nm or greater; and forming a W layer on said W nucleation layer.

This method of the present invention, also includes, forming at least one via from said at least one aperture after said at least one aperture is filled with W.

In one embodiment of the inventive method, the at least one aperture includes a particular sidewall profile. The particular sidewall profile includes, downwardly progressing through the substrate: (1) a first comparatively wide region at a surface of the substrate; (2) a constricted region contiguous with the first comparatively wide region; (3) a second comparatively wide region contiguous with the constricted region; and (4) an inward tapered region contiguous with the second comparatively wide region. The foregoing sidewall profile provides for ease in filling the aperture, while providing for desirable geometric localization of any voids that form when forming the via.

In addition to the methods described above, the present invention also provides through wafer via structures in which the vias of the structures are optimally filled with a conductive metal.

In broad terms, a through wafer via structure is provided that comprises:

a substrate having at least one via formed through said substrate, said at least one via has an aspect ratio of at least 20:1 or greater;

a refractory metal-containing liner located on bare sidewalls of said substrate within said at least one via;

a conductive metal seed layer located on said refractory metal-containing liner, said conductive metal seed layer is enriched with silicon and has a grain size of about 5 nm or less;

a conductive metal nucleation layer on said conductive metal seed layer, said conductive metal nucleation layer is enriched with silicon and has a grain size of about 20 nm or greater; and a conductive metal layer on said conductive metal nucleation layer.

In one embodiment of the inventive structure, the at least one via includes a particular sidewall profile. The particular sidewall profile includes, downwardly progressing through the substrate: (1) a first comparatively wide region at a surface of the substrate; (2) a constricted region contiguous with the first comparatively wide region; (3) a second comparatively wide region contiguous with the constricted region; and (4) an inward tapered region contiguous with the second comparatively wide region.

In a highly preferred embodiment of the invention, a through wafer via structure is provided that comprises:

a substrate having at least one via formed through said substrate, said at least one via has an aspect ratio of at least 20:1 or greater;

a Ti/TiN liner located on bare sidewalls of said substrate within said at least one via;

a W seed layer located on said Ti/TiN liner, said W seed layer is enriched with silicon and has a grain size of about 5 nm or less;

a W nucleation layer on said W seed layer, said W nucleation layer is enriched with silicon and has a grain size of about 20 nm or greater; and a tungsten layer on said W nucleation layer.

In the highly preferred embodiment of the invention, the at least one via includes a particular sidewall profile. The particular sidewall profile includes, downwardly progressing through the substrate: (1) a first comparatively wide region at a surface of the substrate; (2) a constricted region contiguous with the first comparatively wide region; (3) a second comparatively wide region contiguous with the constricted region; and (4) an inward tapered region contiguous with the second comparatively wide region.

It is noted that the terms "enriched with silicon" and "silicon-enriched" when used in conjunction with the terms "conductive metal seed layer", e.g. a W seed layer, and "conductive metal nucleation layer", e.g., W nucleation layer, denotes a layer having a silicon content from about 0.01 atomic % or greater, with a silicon content from about 0.1 to about 1.0 atomic % being more preferred. The enrichment occurs by utilizing a precursor, in addition to a conductive metal precursor, during the deposition of the conductive metal seed layer and the conductive metal nucleation layer that includes silicon. The presence of the silicon-enriched layers provides improved adhesion to the structure which is not obtained when the silicon-enriched layers are not present within the structure.

In the various embodiments mentioned above, the conductive material may completely fill the at least aperture and the at least one via. In another embodiment of the invention, a void may be present within the center of the at least one aperture and the at least one via.

DETAILED DESCRIPTION OF THE INVENTION

Figure 1:
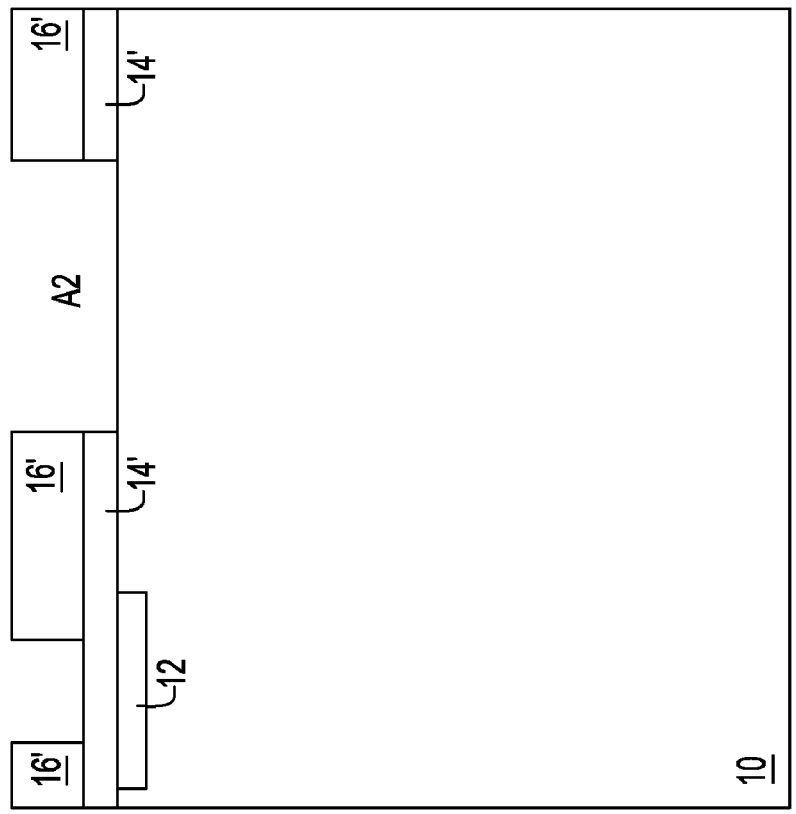
FIGS. 1 to 10 show a series of schematic cross-sectional diagrams illustrating the results of progressive stages in fabricating a microelectronic structure in accordance with a particular embodiment of the invention.

The present invention, which provides a through wafer via structure having optimal conductive metal fill and a method of fabricating the same, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It is observed that the detailed description to be provided herein below represents a preferred embodiment for the sidewall configuration of the at least one aperture and the subsequently formed at least one through via. Although this preferred embodiment is shown and illustrated, the invention also contemplates any other sidewall configuration that has an aspect ratio of about 20:1 or greater, preferably, about 30:1 or greater, and more preferably about 50:1 or greater.

As stated above, the invention provides a method of optimally filling a via within a through wafer via structure with a conductive metal such as, for example, W. The inventive method includes providing a structure including a substrate having at least one aperture at least partially formed through the substrate. The at least one aperture of the structure has an aspect ratio of at least 20:1 or greater. Next, a refractory metal-containing liner such as, for example, Ti/TiN, is formed on bare sidewalls of the substrate within the at least one aperture. A conductive metal seed layer is then formed on the refractory metal-containing liner. In the invention, the conductive metal seed layer formed is enriched with silicon and has a grain size of about 5 nm or less. Next, a conductive metal nucleation layer is formed on the conductive metal seed layer. The conductive metal nucleation layer is also enriched with silicon and has a grain size of about 20 nm or greater. Next, a conductive metal layer is formed on the conductive metal nucleation layer. After performing the above processing steps, a backside planarization process is performed to convert the at least one aperture into at least one through via that is now optimally filled with a conductive metal.

Reference is made to FIGS. 1-10 that shows a series of schematic cross-sectional diagrams illustrating the results of progressive stages in fabricating a microelectronic structure in accordance with a particular embodiment of the invention. This particular embodiment of the invention is a preferred embodiment for the sidewall configuration of the aperture/via formed in the substrate. FIG. 1 shows a schematic cross-sectional diagram of the microelectronic structure at an early stage in the fabrication thereof in accordance with the particular preferred embodiment.

More specifically, FIG. 1 shows a semiconductor substrate 10 that includes a contact region 12 located within the semiconductor substrate 10. The initial structure shown in FIG. 1 also includes an etch stop layer 14 located upon the semiconductor substrate 10 including the contact region 12. A capping layer 16 is located upon the etch stop layer 14. The capping layer 16 includes an aperture therein located above the contact region 12. A first photoresist layer 18 is located upon exposed portions of the etch stop layer 14 and the capping layer 16. The first photoresist layer 18 includes an aperture A1 located over a portion of the substrate 10 that does not include the contact region 12. Each of the foregoing semiconductor substrate 10 and overlying regions and layers 12/14/16/18 may comprise materials, have dimensions and be formed using methods that are otherwise generally conventional in the microelectronic fabrication art.

The semiconductor substrate 10 may comprise any of several semiconductor materials that are otherwise generally conventional in the semiconductor fabrication art. Non-limiting examples include silicon, germanium silicon-germanium alloy, silicon-carbon alloy, silicon-germanium-carbon alloy and compound semiconductor materials. Non-limiting examples of compound semiconductor materials include gallium arsenide semiconductor materials, indium arsenide semiconductor materials and indium phosphide semiconductor materials.

Although this particular preferred embodiment illustrates the invention within the context of a semiconductor substrate 10 that is most generally illustrated as a bulk semiconductor substrate, neither the embodiment nor the invention is necessarily intended to be so limited. Rather the embodiment and the invention also contemplate the use of a semiconductor-on-insulator substrate or a hybrid orientation substrate as the semiconductor substrate 10, in place of a bulk semiconductor substrate.

A semiconductor-on-insulator substrate results from inclusion of a buried dielectric layer interposed between a base semiconductor substrate portion and a surface semiconductor layer portion of the semiconductor substrate 10 that is illustrated in FIG. 1. A hybrid orientation substrate includes multiple crystallographic orientation semiconductor regions supported over a single substrate, which typically comprises a semiconductor substrate.

Semiconductor-on-insulator substrates and hybrid orientation substrates may be fabricated using methods that are generally conventional in the semiconductor fabrication art.

Included in particular, but not necessarily limiting, are layer transfer methods, layer laminating methods and separation by implantation of oxygen methods.

The contact region 12 may comprise any of several contact materials. Non-limiting examples include semiconductor contact materials as well as conductor contact materials. Semiconductor contact materials may include any of several semiconductor materials that are doped appropriately and adequately to serve as contact regions. Conductor contact materials may include, but are not necessarily limited to metals, metal alloys, metal silicides and metal nitrides. Generally, the contact region 12 comprises a semiconductor contact material such as but not limited to a silicon semiconductor contact material, that has a thickness from about 1 to about 100 nanometers.

Although the instant embodiment illustrates the invention within the context of the semiconductor substrate 10 including the contact region 12, the embodiment is also not specifically limited to only a contact region within a semiconductor substrate. Rather, the embodiment also contemplates that the semiconductor substrate 10 includes, located and formed therein, semiconductor devices that are appropriate for a semiconductor circuit which is intended to be fabricated within and upon the semiconductor substrate 10. Such semiconductor devices may include, but are not necessarily limited to, resistors, transistors, diodes and/or capacitors.

Further, while the instant embodiment again illustrates the invention within the context of a semiconductor substrate 10 that is most generally illustrated as a bulk semiconductor substrate, neither the embodiment nor the invention is intended to necessarily be limited to a microelectronic structure that is limited to a semiconductor substrate as a base substrate. Rather the embodiment and the invention also contemplate applicability within the context of base substrates such as but not limited to ceramic substrates. Such ceramic substrates may comprise materials including but not limited to silica, alumina, titania and zirconia ceramic materials.

The etch stop layer 14 comprises an etch stop material. The etch stop material is chosen within the context of a material of composition of the capping layer 16 that is located and formed upon the etch stop layer 14. The etch stop layer 14 will typically comprise a dielectric etch stop material, to adequately isolate conductor structures that are formed incident to further processing of the semiconductor structure that is illustrated in FIG. 1. Candidate dielectric etch stop materials include, but are not necessarily limited to silicon oxide materials, silicon nitride materials and silicon oxynitride materials. Oxides, nitrides and oxynitrides of other elements are not excluded. The etch stop material may also be formed using methods that are generally conventional in the semiconductor fabrication art. Included in particular, but also not limiting are thermal or plasma oxidation or nitridation methods, chemical vapor deposition methods and physical vapor deposition methods. Typically, the etch stop layer 14 comprises a silicon nitride etch stop material that has a thickness from about 1 to about 100 nanometers.

The capping layer 16 may comprise any of several capping materials, which are generally intended as comprising any of the several dielectric materials from which may be comprised the etch stop layer 14. However, for proper etch stop properties of the etch stop layer 14, the etch stop layer 14 and the capping layer 16 must comprise different dielectric materials. When the etch stop layer 14 comprises a silicon nitride material as disclosed above, the capping layer 16 often comprises a silicon oxide material that has a thickness from about 10 to about 2,500 nanometers.

The first photoresist layer 18 may comprise any of several photoresist materials that may be deposited and imaged using otherwise generally conventional coating, photoexposure and development methods that are known in the semiconductor fabrication art. Such photoresist materials may in general include, but are not necessarily limited to, positive photoresist materials, negative photoresist materials and hybrid photoresist materials that have properties of both positive photoresist materials and negative photoresist materials. Typically, the first photoresist layer 18 comprises a positive photoresist material or a negative photoresist material that has a thickness from about 100 to about 2000 nanometers. As is illustrated in FIG. 1, the first photoresist layer 18 also defines an aperture A1 having a linewidth from about 0.5 to about 50 microns.

Figure 2:
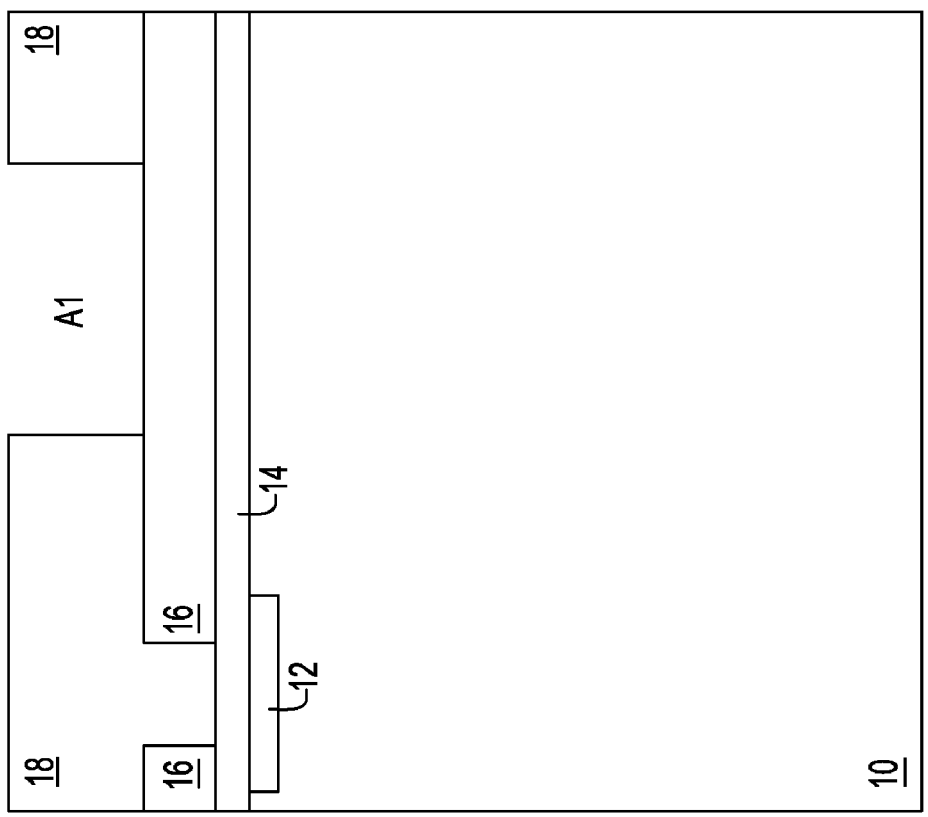

FIG. 2 first shows the results of etching the capping layer 16 and the etch stop layer 14, while using the photoresist layer 18 as a mask, to leave exposed a portion of the semiconductor substrate 10 within an aperture A2 that is defined by an etch stop layer 14' and a capping layer 16' that are formed from the etch stop layer 14 and the capping layer 16. FIG. 2 also shows the results of stripping the first photoresist layer 18 from the resulting etched semiconductor structure to provide the semiconductor structure whose schematic cross-sectional diagram is illustrated in FIG. 2.

The foregoing etching of the capping layer 16 and the etch stop layer 14 to provide the capping layer 16' and the etch stop layer 14' may be effected using etch methods and materials that are otherwise generally conventional in the semiconductor fabrication art. Generally included are wet chemical etch methods and materials, and dry plasma etch methods and materials. Dry plasma etch methods and materials are generally preferred insofar as dry plasma etch methods and materials provide generally straight sidewalls to the etch stop layer 14' and the capping layer 16' that provides the aperture A2. In addition, certain compositions of fluorine containing plasma etch methods may be used for sequentially etching non-selectively silicon containing dielectric materials, such as silicon oxide dielectric materials, silicon nitride dielectric materials and silicon oxynitride dielectric materials.

Subsequent to etching the capping layer 16 and the etch stop layer 14 to form the capping layer 16' and the etch stop layer 14', the first photoresist layer 18 may be stripped using stripping methods and materials that are also otherwise generally conventional in the semiconductor fabrication art. Included in particular are wet chemical stripping methods and materials, dry plasma stripping methods and materials and combinations of wet chemical stripping methods and materials and dry plasma stripping methods and materials.

Figure 3:
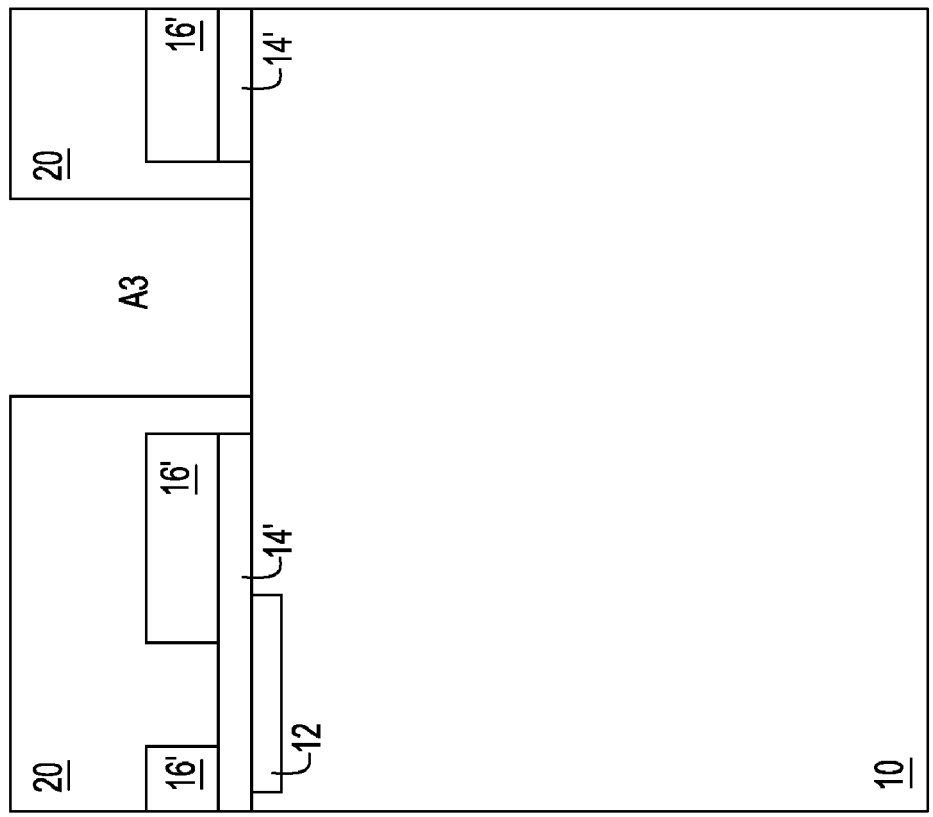

FIG. 3 shows a second photoresist layer 20 located and formed upon the semiconductor structure of FIG. 2. The second photoresist layer 20 forms an aperture A3 at the bottom of which is exposed a portion of the semiconductor substrate 10 that is fully exposed within the second aperture A2 that is defined by the etch stop layer 14' and the capping layer 16' that are illustrated in FIG. 2. This aperture A3 typically has a linewidth from about 0.4 to about 40 microns.

The second photoresist layer 20 may otherwise comprise materials, have a thickness and be formed using methods that are generally conventional in the semiconductor fabrication art, and described in further detail above within the context of the first photoresist layer 18 that is illustrated in FIG. 1.

Figure 4:
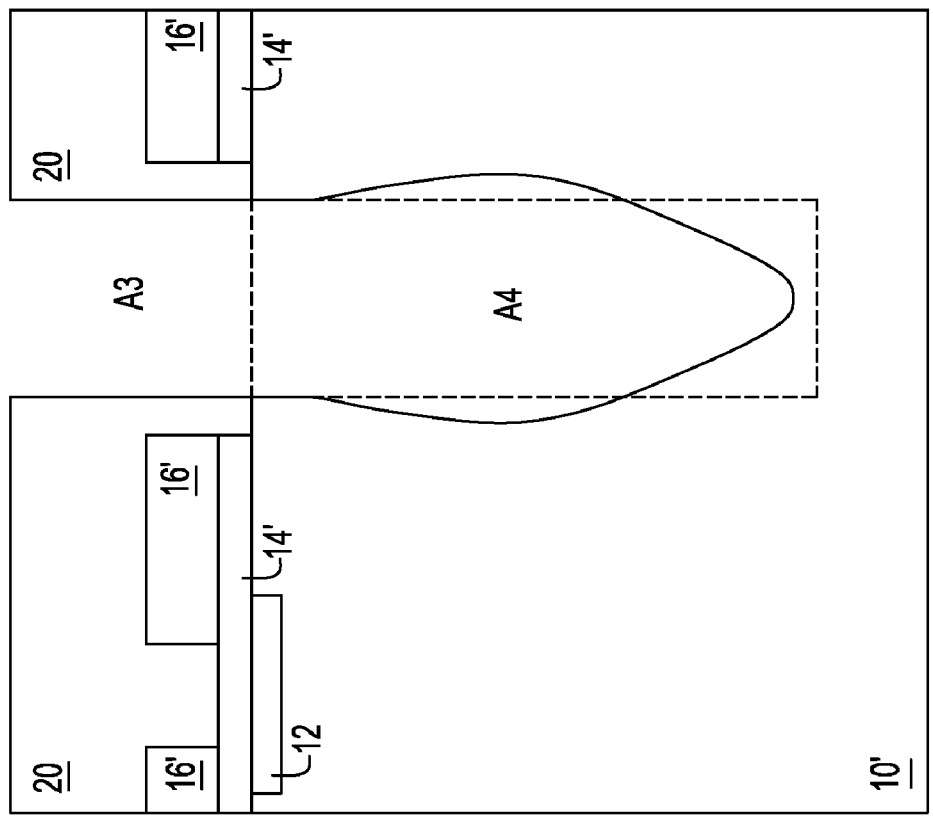

FIG. 4 shows an aperture A4 that is etched into a semiconductor substrate 10' derived from the semiconductor substrate 10 that is illustrated in FIG. 3, while using the second photoresist layer 20 as a mask. As is illustrated within the schematic cross-sectional diagram of FIG. 4, the aperture A4 is formed with a downward pointing torpedo shape. Within FIG. 4, the phantom lines correspond with a theoretical straight sided aperture that may alternatively be formed into the semiconductor substrate 10' while using the second photoresist layer 20 as an etch mask. As is illustrated in FIG. 4, the aperture A4 is wider at the widest point thereof in comparison with the theoretical straight-sided aperture and narrower at the inward pointed tip thereof in comparison with the theoretical straight-sided aperture.

In order to provide the aperture A4 whose schematic cross-sectional diagram is illustrated in FIG. 4 within the semiconductor substrate 10' that is illustrated in FIG. 4, this particular embodiment uses a particular two-step etch method. The particular two-step etch method sequentially uses: (1) a comparatively isotropic first etch step that provides in general the widening of the aperture A4 at the center of the aperture A4; followed by (2) a comparatively anisotropic second etch step that intended as a deep silicon etch method that provides the depth to the aperture A4.

Within the context of the semiconductor substrate 10' when comprised of a silicon semiconductor material, the first etch step uses: (1) a reactor chamber pressure from about 0.04 to about 0.1 torr; (2) a radio frequency source power from about 2000 to about 3000 watts; (3) a substrate bias power from about 0 to about 100 watts; (4) a substrate temperature from about 0 to about 10 degrees centigrade; (5) a sulfur hexafluoride flow rate from about 300 to about 500 standard cubic centimeters per minute; and (6) an oxygen flow rate from about 30 to about 50 standard cubic centimeters per minute.

Within the first etch step, both an etch time (i.e., which will typically be about 15 seconds, but may vary) and the reactor chamber pressure will determine a sidewall outward bow component of the aperture A4. In addition, alternative etchant gas compositions may also be used within the first etch step, in comparison with the etchant gas composition disclosed above.

Within the context of the semiconductor substrate 10' when comprised of a silicon semiconductor material, the second etch step uses: (1) a reactor chamber pressure from about 0.04 to about 0.1 torr; (2) a radio frequency source power from about 1500 to about 2500 watts; (3) a substrate bias power from about 10 to about 250 watts; (4) a substrate temperature from about 0 to about 50 degrees centigrade; (5) a sulfur hexafluoride flow rate from about 250 to about 350 standard cubic centimeters per minute; and (6) an oxygen flow rate of from about 20 to about 35 standard cubic centimeters per minute.

Again, alternative etchant gas compositions may also be used within the second etch step, in comparison with the etchant gas composition disclosed above.

The foregoing second etch step is undertaken for a time period of about 3 to about 10 seconds that is sequentially and alternatively followed by a deposition step that uses: (1) a reactor chamber pressure from about 0.03 to about 0.05 torr; (2) a radio frequency source power from about 1500 to about 2000 watts; (3) a substrate bias power from about 0 to about 50 watts; (4) a substrate temperature from about 0 to about 50 degrees centigrade; and (5) an octafluorocyclobutane flow rate from about 200 to about 300 standard cubic centimeters per minute, for a time period from about 3 to about 7 seconds. The sequential and successive foregoing second etch step and deposition step may be undertaken for a total time from about 30 to about 90 minutes to provide a desired depth to the aperture A4.

Figure 5:
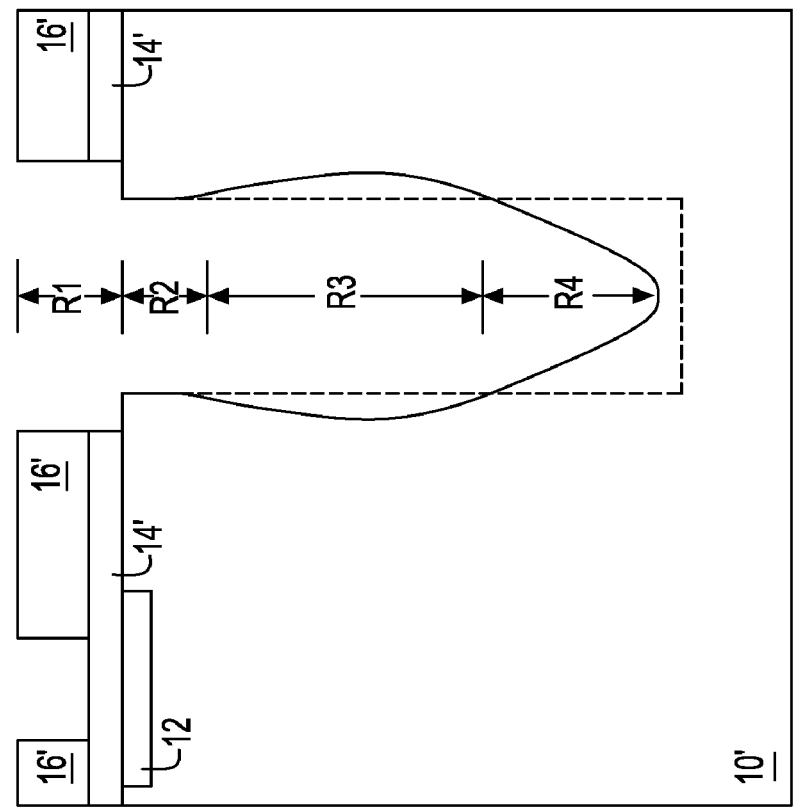

FIG. 5 first shows the results of stripping the second photoresist layer 20 from the semiconductor structure of FIG. 4. The second photoresist layer 20 may be stripped from the semiconductor structure of FIG. 4 to provide the semiconductor structure of FIG. 5 while using methods and materials that are otherwise generally conventional in the semiconductor fabrication art, and that are described above for fabricating the semiconductor structure of FIG. 2 from the semiconductor structure of FIG. 1.

As a result of stripping the second photoresist layer 20 from the semiconductor structure of FIG. 4 to form the semiconductor structure of FIG. 5, an extended aperture (i.e., a vertically extended aperture) is formed from the aperture A4 that is illustrated in FIG. 4. The extended aperture includes: (1) a first region R1 that is a first comparatively wide region having a linewidth from about 3 to about 50 microns defined by the capping layer 16' and the etch stop layer 14' and that extends a vertical distance from about 0.3 to about 10 microns; (2) a second region R2 that is a constricted region having a linewidth from about 1 to about 35 microns and a vertical distance from about 1 to about 30 microns; (3) a third region R3 that is a second comparatively wide region having a linewidth from about 3 to about 50 microns and a vertical distance from about 1 to about 200 microns; and (4) a fourth region having a generally but not necessarily pointed inward taper and a vertical distance from about 1 to about 100 microns. Each of the foregoing regions are sequentially contiguous and penetrating into the semiconductor substrate 10' in the order listed.

Within the instant embodiment, the comparatively wide linewidth of the first region R1, the comparatively wide linewidth of the third region R3 and the inward pointed taper of the fourth region R4 in general are intended to provide for ease in filling the extended aperture. In addition, the constriction within the second region R2 is intended to completely seal off any void that may form within the third region R3, and to localize that void to the third region R3.

Within the disclosed embodiment, sidewall portions of the third region R3 may have the substantially bowed sidewalls as illustrated (i.e., no portion of the sidewalls is aligned in a straight line). Alternatively, sidewall portions of the third region R3 may have substantially straight sidewalls (i.e., all portions of the sidewalls are aligned in a straight line).

In addition, the inward taper within the fourth region R4 may be pronounced and provide the pointed tip as is illustrated in FIG. 5. Alternatively, the inward taper within the fourth region R4 may be less pronounced to provide a blunt tip within the fourth region.

Within the preferred embodiment, the linewidth of the third region R3 is preferably greater than the linewidth of the first region R1 which in turn is preferably greater than the linewidth of the fourth region R4. In addition the linewidth of the first region R1 is preferably at least 1.5 times (and more preferably from about 1.3 to about 1.5 times) the linewidth of the fourth region R4, and the linewidth of the second region R2 is no greater than about 0.9 times (and preferably from about 0.8 to about 0.95 times) the linewidth of the first region R1. Finally, the linewidth of the fourth region R4 is preferably about 0.1 to about 2.0 times a deposition thickness of a conductor layer that is deposited and formed into the extended aperture incident to further processing of the semiconductor structure that is illustrated in FIG. 5 (i.e., illustrated as conductor layer 24 within FIG. 6).

Figure 6:
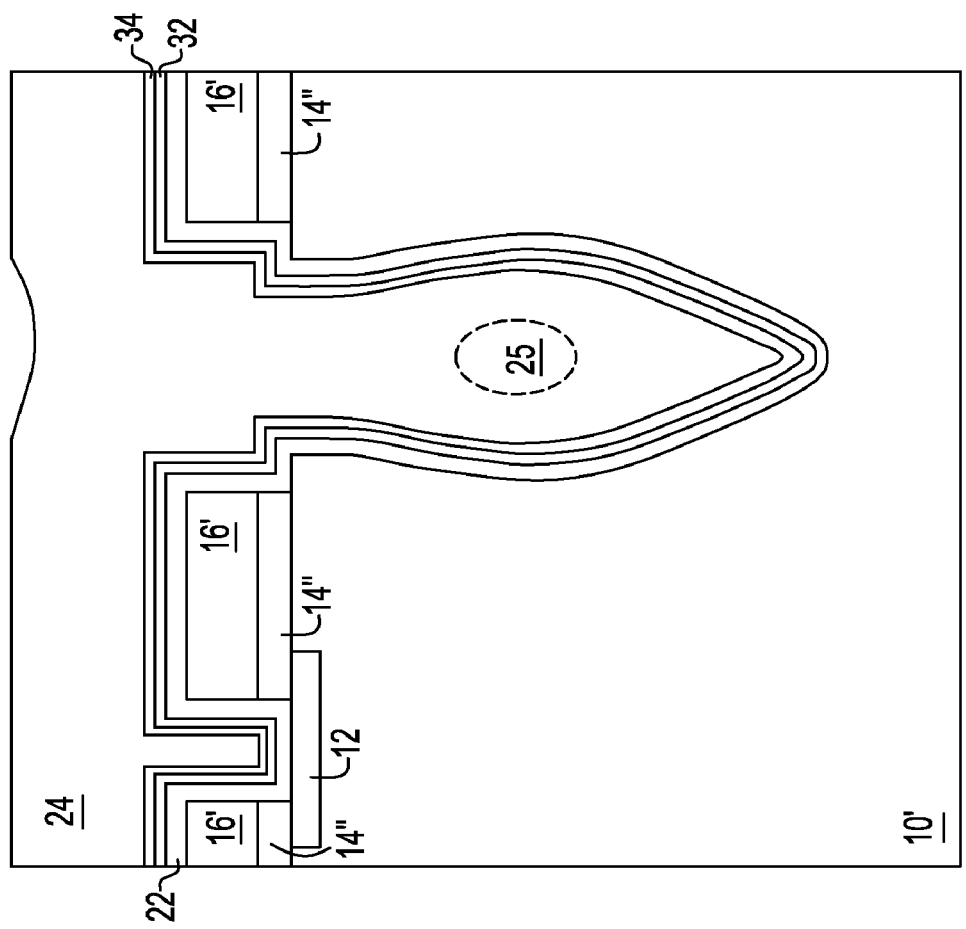

FIG. 6 shows a refractory metal-containing liner 22 located and formed conformally upon the semiconductor structure of FIG. 5 and incompletely filling the extended aperture. FIG. 6 also shows a conductive metal seed layer 32 and a conductive metal nucleation layer 34 located and formed conformally upon the refractory metal-containing liner 22. A conductive metal layer 24 with an optional void 25 located therein, is also shown in FIG. 6 located and formed upon the conductive metal nucleation layer 34. In some embodiments of the invention, the conductive metal layer 24 completely fills the extended aperture. In other embodiments of the invention, the conductive metal layer 24 does not completely fills the extended aperture; there may be some small seam or void 25 through the middle region of the shape.

The refractory metal-containing liner 22 employed in the present invention may comprise any metal or metal alloy that is resistance to high heat, corrosion and wear. Examples of suitable refractory metal-containing materials that can be used as liner 22 include but are not limited to Ti, TiN, Ta, TaN, Ru, RuN, W, WN, Nb, NbN, TiZrN and multilayers thereof. In a highly preferred embodiment of the present invention, the refractory metal-containing liner 22 is comprised of a stack including a lower layer of Ti and an upper layer of TiN.

The refractory metal-containing liner 22 is formed onto the structure shown in FIG. 5 utilizing a conformal deposition process including but not limited to physical vapor deposition (PVP), chemical vapor deposition (CVD), plasma enhanced chemical vapor deposition (PECVD) and atomic layer deposition (ALD). Combinations of these deposition processes can also be used. For example, and in regard to the preferred embodiment in which liner 22 includes Ti/TiN, the Ti layer can be formed by PVD, CVD, or ALD, and the TiN layer can be formed by CVD.

The thickness of the refractory metal-containing liner 22 can vary depending on the deposition technique employed, the material of the refractory metal-containing liner itself, and the number of layers within the liner 22. Typically, and by way of an example, the liner 22 has an as-deposited thickness from about 1 to about 200 nm, with a thickness from about 5 to about 50 nm being even more typical. In the preferred embodiment mentioned above, the Ti layer of liner 22 typically has an as deposited thickness from about 1 to about 100 nm, while the TiN layer of liner 22 typically has a thickness from about 1 to about 100 nm.

In some integration schemes, the smaller aperture on the left side of the drawing may not be filled simultaneous to the large through wafer via on the right side. Instead the left side feature is lined and filled first; the remaining overburden of tungsten or other conductor is removed usually with chemical mechanical polishing, and then the larger through wafer via is formed on the right side and filled. The reason for this is the refractory metal liner 22 and seed layers (to be subsequently formed) are usually thicker than the same liners and seed layers used for the smaller contact on the left side that contacts the wafer devices or transistors.

After forming the refractory metal-containing liner 22, a conductive metal seed layer 32 is formed upon the exposed upper surface of liner 22. The conductive metal seed layer 32 employed in the present invention includes a conductive metal or metal alloy that is enriched with silicon. By "enriched with silicon", it is meant that the conductive metal seed layer 32 of the invention has a silicon content of about 0.01 atomic % with a silicon content of about 0.1 to about 1.0 atomic % being more preferred. The enrichment occurs by utilizing a precursor, in addition to a conductive metal precursor, during the deposition of the conductive metal seed layer that includes silicon. The presence of this silicon-enriched layer provides improved adhesion to the structure which is not obtained when this silicon-enriched layer is not present within the structure.

The conductive metal of the conductive metal seed layer 32 may include any conductive metal or metal alloy which improves the adhesion of the conductive metal 24 to be subsequently formed. Examples of conductive metals for the conductive metal seed layer 32 include but are not limited to W, Al, Cu, Pd, and Rh. In a preferred embodiment of the present invention, the conductive metal of the conductive metal seed layer 32 is W.

In addition to being enriched with silicon, the conductive metal seed layer 32 of the invention also has a grain size that is about 5 nm or less, with a grain size of about 3 nm or less being more preferred.

The conductive metal seed layer 32 described above is formed by ALD utilizing a conductive metal-containing precursor and a precursor that includes silicon. For example, $WF_6$ and $SiH_4$ can be used in the present invention in forming a W seed layer. The conductive metal seed layer is deposited at a deposition temperature from about 250° to about 400° C., with a deposition temperature from about 275° to about 325° C. being even more preferred. The conductive metal seed layer 32 has a thickness that is typically from about 1 to about 100 nm, with a thickness from about 20 to about 40 nm being even more typical.

Next, a conductive metal nucleation layer 34 is formed on the surface of the conductive metal seed layer 32. The conductive metal nucleation layer 34 employed in the present invention includes a conductive metal or metal alloy that is enriched with silicon. By "enriched with silicon", it is meant that the conductive metal nucleation layer 34 of the invention has a silicon content of about 0.01 atomic % or greater, with a silicon content from about 0.1 to about 1.0 atomic % being more preferred. The enrichment occurs by utilizing a precursor, in addition to a conductive metal precursor, during the deposition of the conductive metal nucleation layer that includes silicon. The presence of this silicon-enriched layer also provides improved adhesion to the structure which is not obtained when this silicon-enriched layer is not present within the structure.

The conductive metal of the conductive metal nucleation layer 34 includes any conductive metal or metal alloy which aids in the formation of conductive metal 24 to be subsequently formed. Typically, the conductive metal nucleation layer, the conductive metal seed layer, and the conductive metal seed layer comprise the same conductive metal. Examples of conductive metals for the conductive metal nucleation layer 34 include but are not limited to W, Al, Cu, Pd, and Rh. In a preferred embodiment of the present invention, the conductive metal of the conductive metal nucleation layer 34 is W.

In addition to being enriched with silicon, the conductive metal nucleation layer 34 of the invention also has a grain size that is about 20 nm or greater, with a grain size from about 3 to about 10 nm being more preferred.

The conductive metal nucleation layer 34 described above is formed by CVD or PECVD utilizing a conductive metal-containing precursor and a precursor that includes silicon. For example, $WF_6$ and $SiH_4$ can be used in the present invention in forming a W nucleation layer. The conductive metal nucleation layer 34 is deposited at a deposition temperature from about 350° to about 450° C., with a deposition temperature from about 375° to about 425° C. being even more preferred. The conductive metal nucleation layer 34 has a thickness that is typically from about 1 to about 100 nm, with a thickness from about 25 to about 50 nm being even more typical.

Next, the conductive metal layer 24 is formed on the exposed surface of the conductive metal nucleation layer 34. The conductive metal layer 24 employed in the present invention, comprises one of W, Al, Cu, Pd, and Rh. In a preferred embodiment of the present invention, the conductive metal 24 is W. The conductive metal layer 24 is formed utilizing CVD, PECVD or any other method that can fill the remaining extended aperture with the conductive metal. The conductive metal layer 24 is deposited at a deposition temperature from about 350° to about 450° C., with a deposition temperature from about 375° to about 425° C. being even more preferred. The conductive metal layer 24 has a thickness that is typically from about 0.5 to about 3.0 microns, with a thickness of about 2.5 microns being even more typical.

As is illustrated by the phantom line enclosure within the schematic diagram of FIG. 6, the conductive metal layer 24 may be deposited or formed with a void 25, but due to the irregular sidewall curvature of the extended aperture, the void 25 is localized to the second comparatively wide region R3 of the extended aperture and, as such, it is typically positioned in a center portion of the extended aperture.

Figure 7:
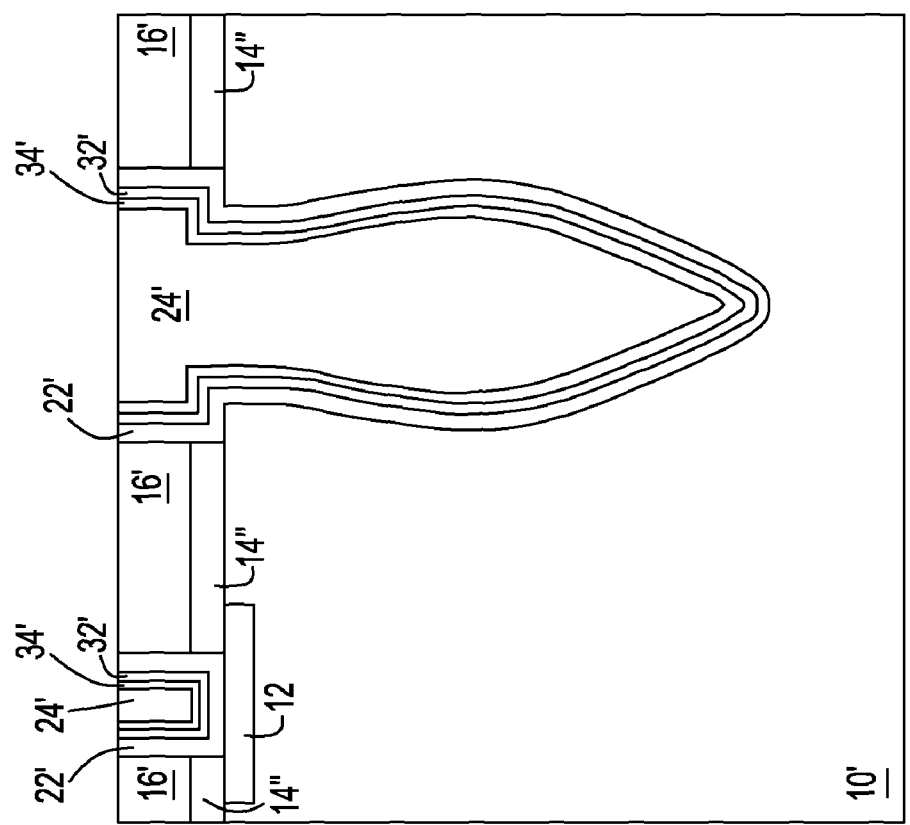

FIG. 7 shows the results of planarizing the semiconductor structure of FIG. 6 to provide a plurality of refractory metal liners 22', conductive metal seed layers 32' and conductive metal nucleation layers 34'. Note that in the drawing one of the refractory metal liners 22' is in contact with the contact region 12 and another penetrates into the semiconductor substrate 10'. The planarizing of the semiconductor structure of FIG. 6 to provide the semiconductor structure of FIG. 7 also provides a conductive metal layer 24' located and formed upon each conductive metal nucleation layer 34'. The semiconductor structure of FIG. 6 may be planarized to form the semiconductor structure of FIG. 7 while using planarizing methods and materials that are otherwise generally conventional in the semiconductor fabrication art. Included in particular are mechanical planarizing methods and chemical mechanical polish planarizing methods. Chemical mechanical polish planarizing methods are generally more common.

Figure 8:
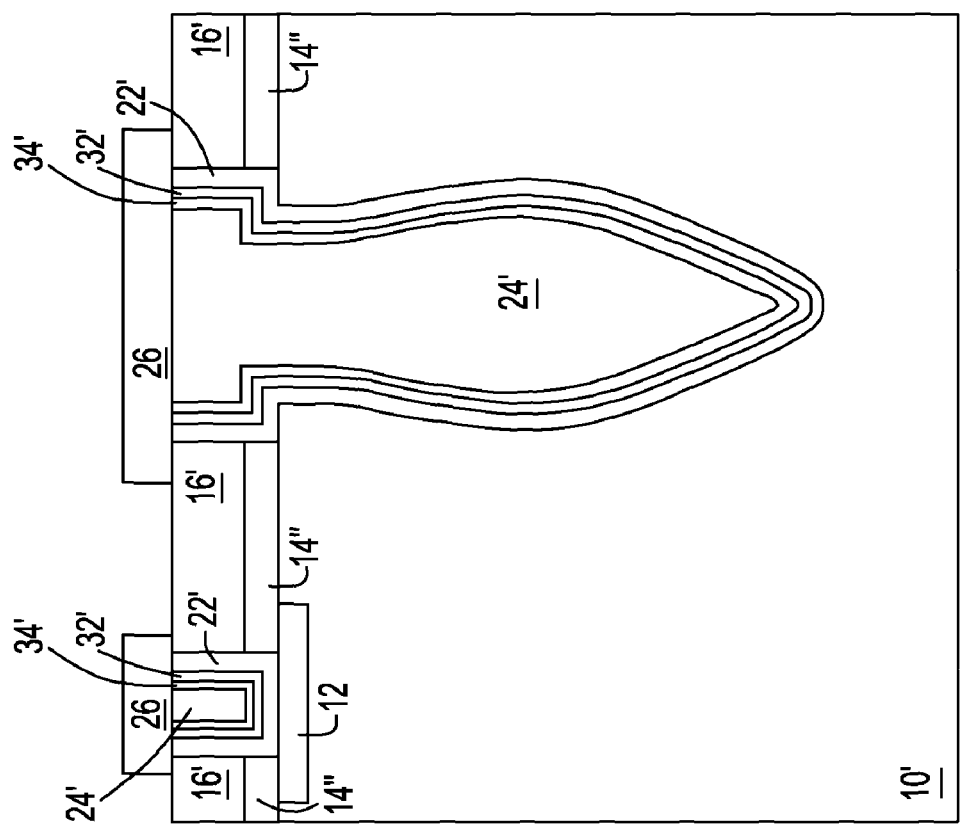

FIG. 8 shows a plurality of first interconnect layers 26 located and formed contacting the plurality of conductive metal layers 24'. The plurality of first interconnect layers 26 also comprise a conductor material that may generally be selected from the group including but not limited to metal, metal alloy, metal nitride and metal silicide conductor materials. Commonly, the plurality of first interconnect layers 26 comprise a copper interconnect material that has a thickness from about 300 to about 1000 nm, although neither the embodiment nor the invention is so limited. The plurality of first interconnect layers 26 may be formed using methods and materials that are otherwise generally conventional in the semiconductor fabrication art. Such methods include, but are not necessarily limited to, blanket layer deposition methods in conjunction with photolithographic and etch methods that are otherwise generally conventional in the semiconductor fabrication art.

Figure 9:
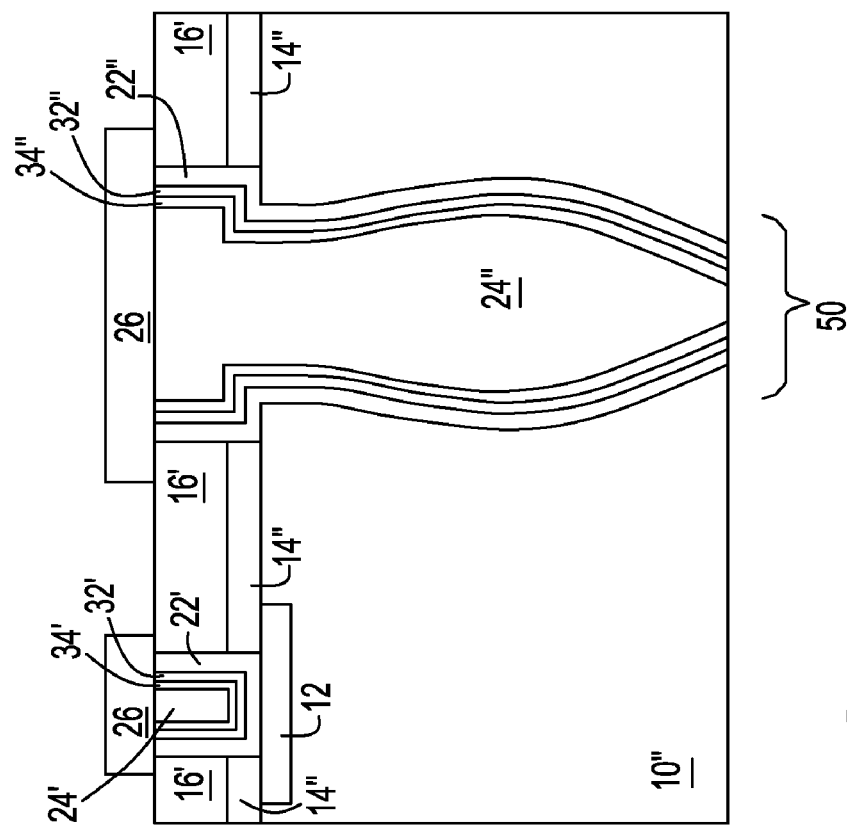

FIG. 9 shows a semiconductor substrate 10", a refractory metal liner 22", a conductive metal seed layer 32", a conductive metal nucleation layer 34" and a conductive metal layer 24" that result from a backside planarizing of the structure that is illustrated in FIG. 8. This backside planarization forms a through via 50 within substrate 10". Such a backside planarizing is intended to remove a thickness from about 0.1 to about 500 microns from the semiconductor substrate 10' while leaving exposed portions of the refractory metal liner 22", the conductive metal seed layer 32", the conductive metal nucleation layer 34" and the conductive metal layer 24". The foregoing backside planarizing may also be effected using methods that are otherwise generally conventional in the semiconductor fabrication art. Such methods may also include mechanical polish planarizing methods and chemical mechanical polish planarizing methods. However, given an amount of semiconductor material that is desired to be removed in forming the semiconductor substrate 10" from the semiconductor substrate 10', at least in part a mechanical polish planarizing method is used.

Figure 10:
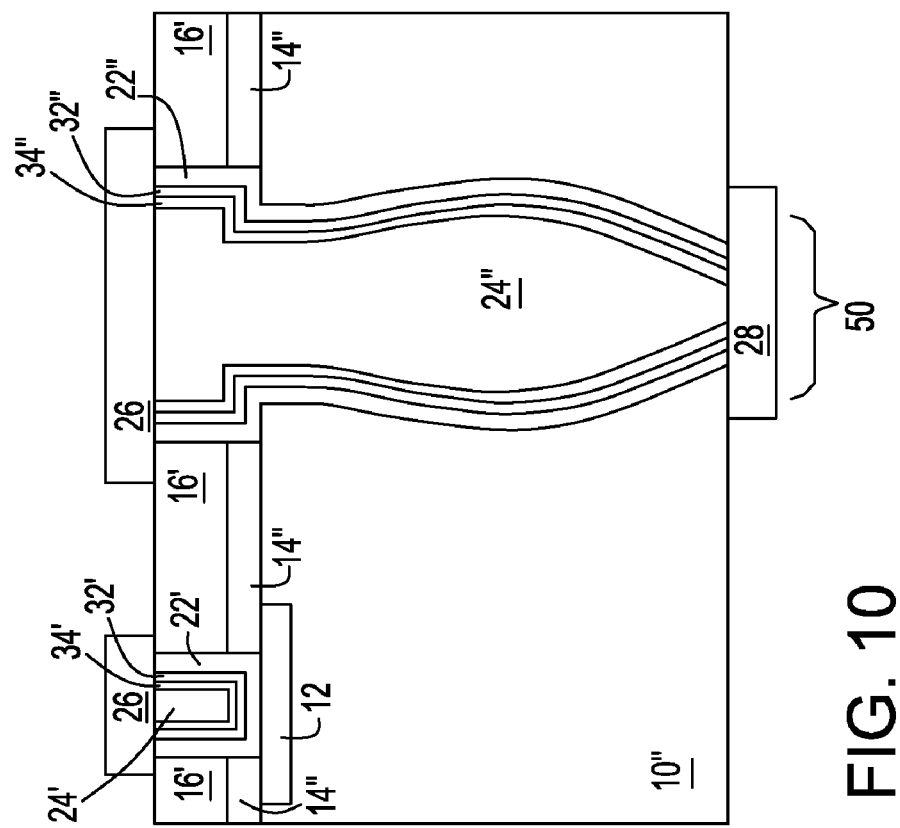

FIG. 10 shows a second interconnect layer 28 located and formed contacting an exposed bottom portion of the conductive metal 24". Such a second interconnect layer 28 may comprise materials, have dimensions and be formed using methods analogous, equivalent or identical to the materials, dimensions and methods used for fabricating the plurality of first interconnect layers 26 that is illustrated in FIG. 8.

FIG. 10 shows a schematic cross-sectional diagram of a semiconductor structure in accordance with a particular embodiment of the invention that comprises a highly preferred embodiment of the invention with respect to the sidewall configuration of the via and the aperture used in forming the via. The semiconductor structure includes a through wafer via 50 that penetrates from a front side of a semiconductor substrate 10" to a backside of the semiconductor substrate 10". The through wafer via 50 is located and formed into an aperture within the semiconductor substrate 10" of FIG. 10 that has an irregular sidewall profile. Progressing from the top surface to the bottom surface of the semiconductor structure that is illustrated in FIG. 10, the irregular sidewall aperture includes: (1) a first comparatively wide region laterally bounded by the capping layer 16' and the etch stop layer 14'; (2) a constricted region contiguous with and below the first comparatively wide region; (3) a second comparatively wide region contiguous with and below the constricted region; and (4) an inward tapered region contiguous with and below the second comparatively wide region.

Within this particular embodiment, the first comparatively wide region of the aperture aids in efficiently filling the aperture with the conductive material (i.e., conductive layer 24") that forms the through wafer via 50. The constricted region provides for surface closure of any voids that may form in the second comparatively wide region. The second comparatively wide region, due to the increase in linewidth thereof, provides for ease in filling the aperture. Finally, the inward tapered region allows for ease in filling at least a bottom portion of the aperture absent forming a void within the via that is filled into the aperture. While the instant embodiment illustrates the invention within the context of a single aperture and through wafer via 50 within a semiconductor substrate, a multiplicity of dimensionally similar or dimensionally identical apertures and corresponding vias may also be used within a single substrate, such as a single semiconductor substrate.

It is again worth point out that the inventive through wafer via structure includes a substrate 10" having at least one via 50 formed through said substrate, said at least one via 50 has an aspect ratio of at least 20:1 or greater. The at least one through wafer via (i.e., via 50) includes a refractory metal-containing liner 32" located on bare sidewalls of the substrate 10" within said at least one via. A conductive metal seed layer 34" is located on the refractory metal-containing liner 22". In the invention, the conductive metal seed layer 34" is enriched with silicon and has a grain size of about 5 nm or less. A conductive metal nucleation layer 34" is present on the conductive metal seed layer 32". In accordance with the invention, the conductive metal nucleation layer 34" is enriched with silicon and has a grain size of about 20 nm or greater. A conductive metal 24" is located on the conductive metal nucleation seed layer 34".

In some embodiments, void 25 is formed within the conductive, conductive metal layer 24". In yet other embodiments, the at least one aperture and thus the resultant at least one substrate via is cylindrical in shape.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a through wafer via structure comprising:

providing a structure including a substrate having at least one aperture at least partially formed through said substrate, said at least one aperture having an aspect ratio of at least 20:1 or greater and said at least one aperture includes a sidewall profile comprising: a first comparatively wide region at a surface of the substrate; a constricted region contiguous with the first comparatively wide region; a second comparatively wide region contiguous with the constricted region; and an inward tapered region contiguous with the second comparatively wide region;

forming a refractory metal-containing liner on bare sidewalls of said substrate within said at least one aperture;

forming a conductive metal seed layer on said refractory metal-containing liner, said conductive metal seed layer is enriched with silicon and has a grain size of about 5 nm or less;

forming a conductive metal nucleation layer on said conductive metal seed layer, said conductive metal nucleation layer is enriched with silicon and has a grain size of about 20 nm or greater; and forming a conductive metal layer on said conductive metal nucleation layer.

2. The method of claim 1 further comprising forming at least one via from said at least one aperture after said at least one aperture is filled with said conductive metal layer.

3. The method of claim 2 wherein said forming said at least one via includes a backside planarization process.

4. The method of claim 1 wherein said at least one aperture sidewall profile is provided utilizing a two-step etching process, said two-step etching process comprises a first comparatively isotropic etch followed by a second comparatively anisotropic etch.

5. The method of claim 1 wherein said refractory metal-containing liner comprises at least one of Ti, TiN, Ta, TaN, Ru, RuN, W, WN, Nb, NbN and TiZrN.

6. The method of claim 1 wherein said refractory metal-containing liner comprises a stack of Ti and TiN.

7. The method of claim 1 wherein said conductive metal seed layer, said conductive metal nucleation layer, and said conductive metal layer comprise a same conductive metal and are selected from at least one of W, Al, Cu, Pd and Rh.

8. The method of claim 1 wherein said conductive metal seed layer, said conductive metal nucleation layer and said conductive metal layer each comprises W.

9. The method of claim 1 wherein said conductive metal seed layer is formed by atomic layer deposition utilizing a precursor including at least one conductive material and another precursor including at least silicon.

10. The method of claim 1 wherein said conductive metal nucleation layer is formed by chemical vapor deposition utilizing a precursor including at least one conductive material and another precursor including at least silicon.

11. A method of forming a tungsten through wafer structure comprising:

providing a structure including a substrate having at least one aperture at least partially formed through said substrate, said at least one aperture having an aspect ratio of at least 20:1 or greater and said at least one aperture includes a sidewall profile comprising: a first comparatively wide region at a surface of the substrate; a constricted region contiguous with the first comparatively wide region; a second comparatively wide region contiguous with the constricted region; and an inward tapered region contiguous with the second comparatively wide region.

forming a Ti-containing liner on bare sidewalls of said substrate within said at least one aperture;

forming a W seed layer on said Ti-containing liner, said W seed layer is enriched with silicon and has a grain size of about 5 nm or less;

forming a W nucleation layer on said W seed layer, said W nucleation layer is enriched with silicon and has a grain size of about 20 nm or greater; and forming a W layer on said W nucleation seed layer.

12. The method of claim 11 further comprising forming at least one via from said at least one aperture after said at least one aperture is filled with said W layer.

13. The method of claim 12 wherein said forming said at least one via includes a backside planarization process.

14. The method of claim 11 wherein said at least one aperture sidewall profile is provided utilizing a two-step etching process, said two-step etching processes comprises a first comparatively isotropic etch followed by a second comparatively anisotropic etch.

15. The method of claim 11 wherein said W seed layer is formed by atomic layer deposition utilizing a $WF_6$ precursor and another precursor including at least silicon.

16. The method of claim 11 wherein said W nucleation layer is formed by chemical vapor deposition utilizing a $WF_6$ precursor and another precursor including at least silicon.

17. A through wafer via structure comprising:

a substrate having at least one via formed through said substrate, said at least one via has an aspect ratio of at least 20:1 or greater and said at least one via includes a sidewall profile comprising: a first comparatively wide region at a surface of the substrate; a constricted region contiguous with the first comparatively wide region; a second comparatively wide region contiguous with the constricted region; and an inward tapered region contiguous with the second comparatively wide region;

a refractory metal-containing liner located on bare sidewalls of said substrate within said at least one via;

a conductive metal seed layer located on said refractory metal-containing liner, said conductive metal seed layer is enriched with silicon and has a grain size of about 5 nm or less;

a conductive metal nucleation layer on said conductive metal seed layer, said conductive metal nucleation layer is enriched with silicon and has a grain size of about 20 nm or greater; and a conductive metal layer on said conductive metal nucleation layer.

18. The through wafer via structure of claim 17 wherein said refractory metal-containing liner comprises at least one of Ti, TiN, Ta, TaN, Ru, RuN, W, WN, Nb, NbN and TiZrN.

19. The through wafer via structure of claim 17 wherein said refractory metal-containing liner comprises a stack of Ti and TiN.

20. The through wafer via structure of claim 17 wherein said conductive metal seed layer, said conductive metal nucleation layer, and said conductive metal layer comprise a same conductive metal and are selected from at least one of W, Al, Cu, Pd and Rh.

21. The through wafer via structure of claim 17 wherein said conductive metal seed layer, said conductive metal nucleation layer and said conductive metal layer each comprises W.

22. A through wafer via structure comprising:
a substrate having at least one via formed through said substrate, said at least one via has an aspect ratio of at least 20:1 or greater and said at least one via includes a sidewall profile comprising: a first comparatively wide region at a surface of the substrate: a constricted region contiguous with the first comparatively wide region; a second comparatively wide region contiguous with the constricted region; and an inward tapered region contiguous with the second comparatively wide region;
a Ti/TiN liner located on bare sidewalls of said substrate within said at least one via;
a W seed layer located on said Ti/TiN liner, said W seed layer is enriched with silicon and has a grain size of about 5 nm or less;
a W nucleation layer on said W seed layer, said W nucleation layer is enriched with silicon and has a grain size of about 20 nm or greater; and
a tungsten layer on said W nucleation layer.

* * * * *